United States Patent [19]

Takahashi

[11] Patent Number: 4,544,885
[45] Date of Patent: Oct. 1, 1985

[54] CATHODE RAY OSCILLOSCOPE WITH A DUAL CONTROL KNOB ASSEMBLY FOR EASY ZERO LEVEL ADJUSTMENT

[75] Inventor: Toru Takahashi, Wako, Japan

[73] Assignee: Iwatsu Electric Co., Ltd., Tokyo, Japan

[21] Appl. No.: 485,430

[22] Filed: Apr. 15, 1983

[30] Foreign Application Priority Data

Apr. 28, 1982 [JP] Japan .................. 57-73184

[51] Int. Cl.$^4$ .......................................... G01R 13/22
[52] U.S. Cl. ................................................ 324/121 R
[58] Field of Search .............. 324/121 R, 88; 338/200; 200/159 B

[56] References Cited

U.S. PATENT DOCUMENTS

| 3,312,925 | 4/1967 | Frantz | 338/200 |
| 4,363,018 | 12/1982 | Matsui et al. | 338/200 X |
| 4,398,170 | 8/1983 | Nishikawa | 338/200 X |
| 4,420,663 | 12/1983 | Larson et al. | 200/159 B |

FOREIGN PATENT DOCUMENTS 2058462  4/1981  United Kingdom ............ 200/159 B

OTHER PUBLICATIONS

Tektronix General Products Catalog, 1980, p. 79.

IBM Technical Disclosure Bulletin, Kuntzelman, H., "Keyboard Transducer," May 1965, p. 1170.

*Primary Examiner*—Stewart J. Levy
*Assistant Examiner*—Stephen M. Baker
*Attorney, Agent, or Firm*—Woodcock, Washburn, Kurtz, Mackiewicz & Norris

[57] ABSTRACT

A cathode ray oscilloscope having a vertical or signal amplifier connected between a signal input terminal and a cathode ray tube for amplifying an input signal to be observed or measured. Upon disconnection of the vertical amplifier from the input terminal the cathode ray tube exhibits on its screen a bright horizontal line representative of a zero signal level. For the easy adjustment or setting of this zero signal level there is provided a one-hand-operable dual control knob assembly typically in the form of a concentric arrangement of first and second knobs. The first knob is to be pushed for activating a zero level switch, thereby to disconnect the vertical amplifier from the signal input. Sleeved upon the first knob, the second knob is to be turned for operating a potentiometric vertical position adjuster thereby to cause the bright line to move up and down on the cathode ray tube screen. The manipulation of only the first knob results in the appearance of the bright line on the screen, thus making possible the ready reconfirmation of the zero signal level.

7 Claims, 10 Drawing Figures

CATHODE RAY OSCILLOSCOPE WITH A DUAL CONTROL KNOB ASSEMBLY FOR EASY ZERO LEVEL ADJUSTMENT

BACKGROUND OF THE INVENTION

My invention relates to a cathode ray oscilloscope (CRO) or a device incorporating a cathode ray tube (CRT) for sensing and plotting various electrical quantities, or electrical analogs of various physical phenomena, for observation or measurement. More specifically my invention deals with improved means in a CRO for the easy adjustment, as well as reconfirmation, of a zero signal level as represented by a bright horizontal line on a CRT screen.

CROs in general have two orthogonal axes, X and Y, for conveying quantitative information. The X or horizontal axis is normally a linear function of time whereas the Y or vertical axis is linear function of the voltage at the signal input terminal of the instrument. According to a known CRO configuration (shown in FIG. 1 of the drawings attached hereto), the input terminal is connected to the CRT via an input selector and a vertical or signal amplifier. A vertical position adjuster is also connected to the vertical amplifier.

For the setting of the zero signal level on the CRT screen preparatory to signal observation or measurement, the user first operates the input selector to ground the signal input of the vertical amplifier. Thereupon the CRT displays a bright horizontal line. The user proceeds to operate the vertical position adjuster to set the bright line on a desired one of the vertical axis graduations on the CRT screen. Then he again actuates the input selector to reconnect the input terminal to the vertical amplifier, thereby making the instrument ready for the display of an input signal.

Thus the prior art construction has required the user to manipulate the two separate control knobs, associated with the input selector and the vertical position adjuster, for zero level adjustment. I will later explain the difficulties involved in the conventional practice of zero level adjustemnt in some more detail.

SUMMARY OF THE INVENTION

My invention aims at the provision of a CRO that allows far easier adjustemnt, as well as reconfirmation, of a zero signal level on a CRT screen than heretofore, thereby expediting the observation or measurement of desired electrical quantities.

Stated briefly, my invention is directed to a CRO of the type having a vertical amplifier connected between signal input means and a CRT, with the latter displaying a bright horizontal line on its screen representative of a zero signal level upon disconnection of the vertical amplifier from the input means, and a vertical position adjuster connected to the vertical amplifier and operable manually for adjustably varying the vertical position of the display on the CRT screen. The improved means of my invention comprise a zero level switch connected between the input means and the vertical amplifier and actuable manually for connecting and disconnecting them to and from each other. A one-hand-operable dual control knob assembly is conveniently positioned on the device for operating both the vertical position adjuster and the zero level switch.

As has been mentioned, the adjustment of the zero signal level on the CRT screen necessitates the disconnection of the vertical amplifier from the input means and the manipulation of the vertical position adjuster. The dual control knob assembly of my invention allows the user to simultaneously perform both of these operations with one hand.

Typically the dual control knob assembly comprises a first knob to be pushed for activating the zero level switch, and a second knob concentrically sleeved upon the first knob and adapted to be turned for operating the vertical position adjuster. Thus the user may turn the second knob while pushing the first. The manipulation of the dual control knob assembly makes possible the faster setting of the zero level in the CRT screen than the conventional practice of operating the two remotely positioned knobs for the input selector and the vertical adjuster.

The user may forget where he has set the zero level during the subsequent observation or measurement of the input signal. In that case he may simply push the first knob of the dual control knob assembly whereupon the bright line will appear in the preset position on the CRT screen. Further, upon release of the hand pressure on the first knob, the screen will immediately display the input signal. It is thus seen that the improved CRO of my invention is well designed to permit ready adjustment and reconfirmation of the zero level on the CRT screen.

The above and other objects, features and advantages of my invention and the manner of attaining them will become more apparent, and the invention itself will best be understood, from a study of the following description and appended claims taken together with the accompanying drawings.

DETAILED DESCRIPTION

Figure 1:
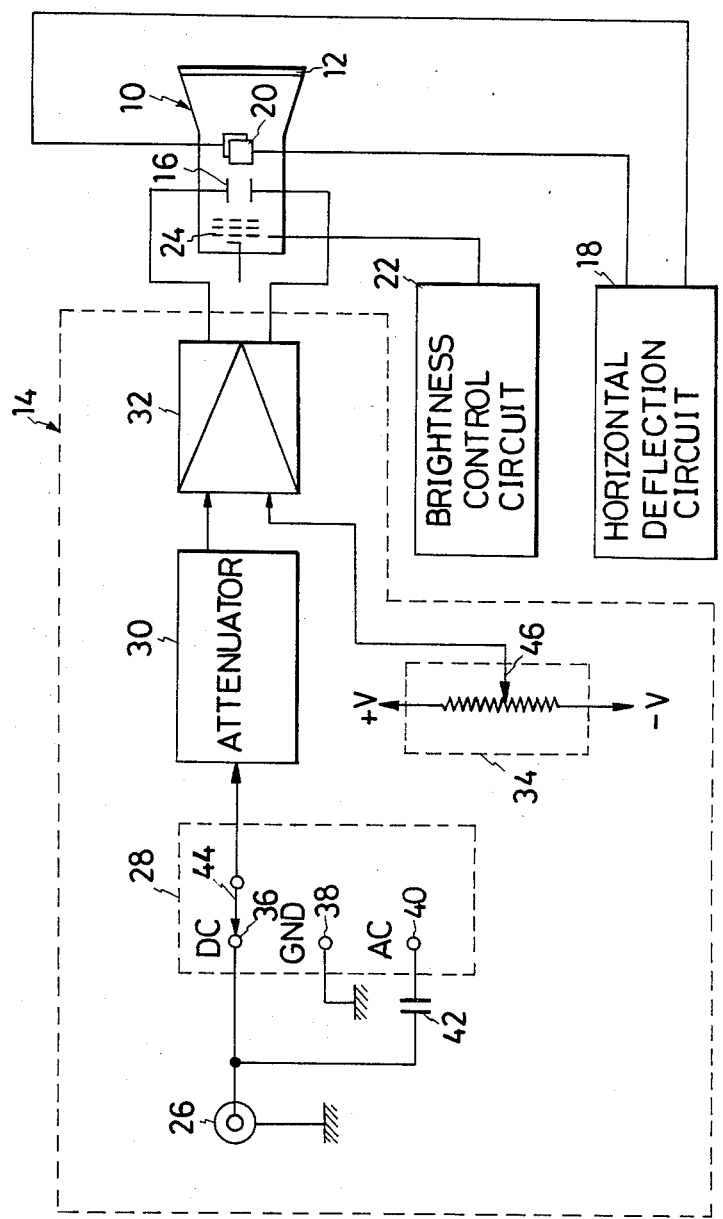
FIG. 1 is a schematic electrical diagram, partly in block form, of a typical prior art CRO.

I will first briefly explain the prior art CRO configuration of FIG. 1 in order to make clearer the problems arising in connection with zero level setting. The CRO has four basic parts:

1. A CRT 10 having a fluorescent screen 12.
2. A vertical deflection circuit 14 for the delivery of a signal to be observed or measured to a pair of vertical deflection electrodes 16 of the CRT 10.
3. A horizontal deflection circuit 18 for the delivery of a horizontal sweep signal to a pair of horizontal deflection electrodes 20 of the CRT 10.
4. A brightness or intensity control circuit 22 for the delivery of a brightness control signal to a control grid 24 of the CRT 10.

Of the three listed control circuits for the CRT 10, the horizontal deflection circuit 18 and the brightness control circuit 22 have no direct bearing to my invention. I have therefore shown only the vertical deflection circuit 14 in greater detail. It comprises:

1. An input terminal 26 for the reception of a signal to be observed or measured.
2. An input selector 28 connected to the input terminal 26.
3. An attenuator 30.
4. A vertical or signal amplifier 32 for amplifying the input signal received from the attenuator 30 prior to application to the CRT 10.
5. A vertical position adjuster 34 connected to an input of the vertical amplifier 32 for adjustably varying the vertical position of the display on the CRT screen 12.

The input selector 28 is a three-position switch comprising a first or direct current (DC) contact 36 connected directly to the input terminal 26, a second or ground (GND) contact 38 connected to ground, a third or alternating current (AC) contact 40 connected to the input terminal 26 via a capacitor 42, and a movable contact 44 connected to the attenuator 30. The vertical position adjuster 34 takes the form of a potentiometer having a sliding contact or slider 46 connected to the vertical amplifier 32.

Figure 2:
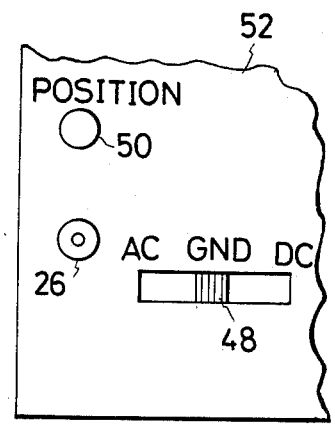
FIG. 2 is a fragmentary elevation of the front panel of the prior art CRO, showing in particular some control knobs essential for a full appreciation of my invention.

As shown fragmentarily in FIG. 2, the front panel 52 of the CRO has an input selector knob 48, a vertical position control knob 50, and the signal input terminal 26 suitably arranged thereon. The input selector knob 48 is to be shifted linearly for moving the movable contact 44 of the input selector 28 into engagement with any of the three fixed contacts 36, 38 and 40. Coupled to the slider 46 of the vertical position adjuster 34, the vertical position control knob 50 is to be turned in either direction for moving the display up or down on the CRT screen 12.

Figure 3:
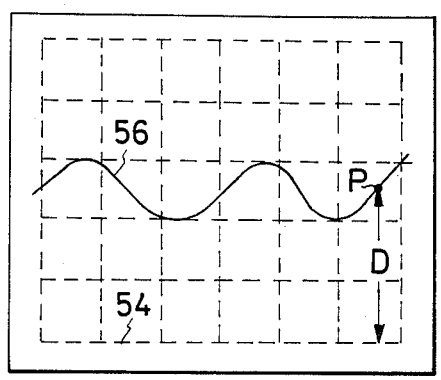
FIG. 3 shows an example of display on a CRT screen for the explanation of operation of the prior art, as well as inventive, CRO.

The user has had to perform the following sequence of operating steps for measuring the magnitude (voltage) of an input signal by the prior art CRO of the foregoing construction:

1. Shifting the input selector knob 48 on the front panel 52 to the GND position thereby grounding the signal input of the vertical amplifier 32 and so causing a bright horizontal line to appear on the CRT screen 12.
2. Turning the vertical position control knob 50 on the front panel 52 for adjusting the bright line to a desired one of the vertical axis graduations of the CRT screen 12, for example, to the lowermost one 54 in FIG. 3, thereby setting the zero signal level.
3. Keeping the thus adjusted zero level in mind.
4. Again shifting the input selector knob 48 to the DC position for directly connecting the input terminal 26 to the attenuator 30 and thence to the vertical amplifier 32, with the result that the CRT displays the waveform of the input signal on its screen 12, as indicated at 56 in FIG. 3.
5. Reading the distance D of a desired point P on the displayed waveform 12 from the zero level at 54.
6. Multiplying the distance H by the deflection sensitivity (voltage per unit distance) to obtain the voltage.

Thus the user has had to manipulate the input selector knob 48, the vertical position control knob 50, and again the input selector knob preparatory to signal observation or measurement. Further the zero level is not necessarily set on one and the same graduation on the CRT screen, so that the user may forget where he has set the zero level. In that case he has had to again operate the input selector knob 48 back and forth. My invention thoroughly overcomes these inconveniences of the prior art.

PREFERRED EMBODIMENT

Figure 4:
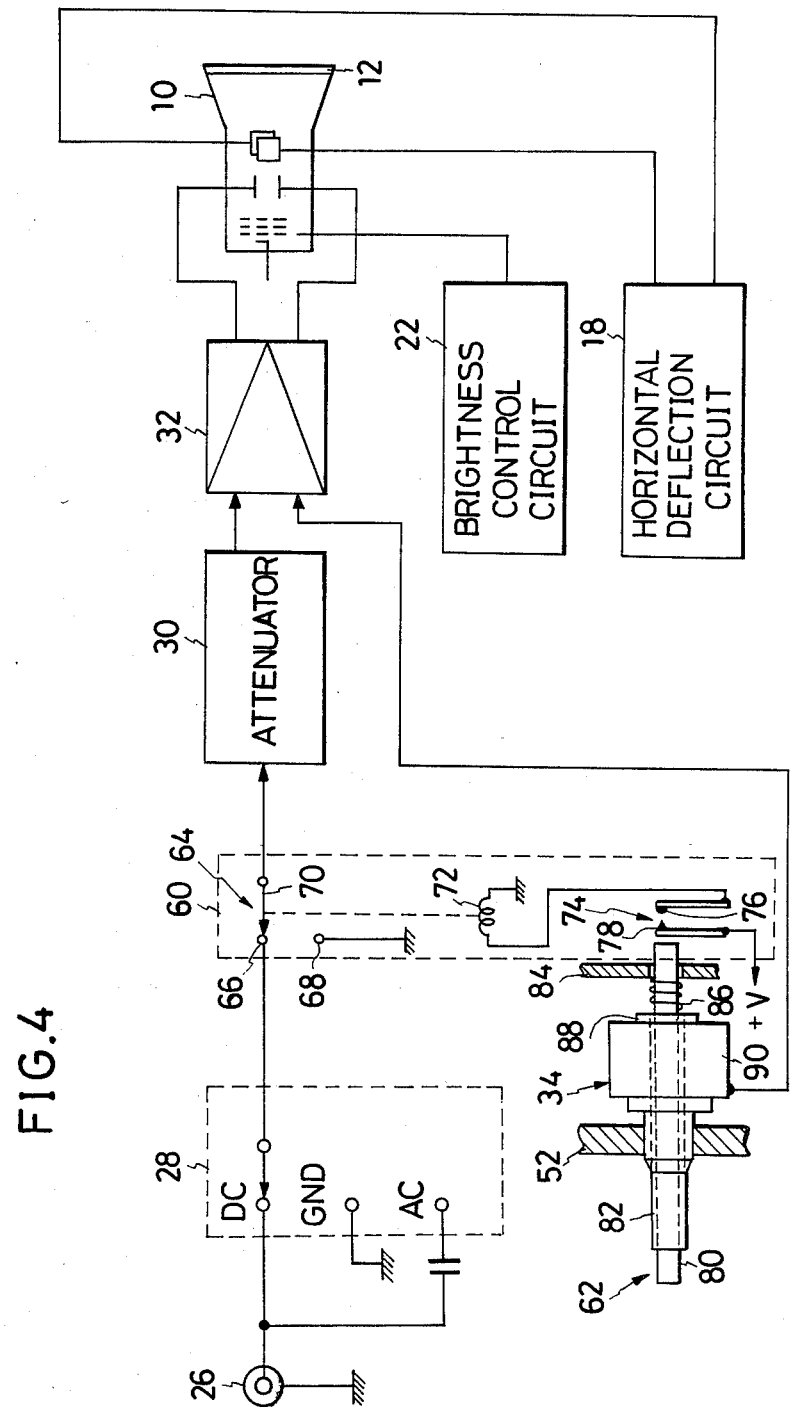
FIG. 4 is a schematc electrical diagram, partly in block form, of the CRO embodying the principles of my invention, the figure including an elevational view of a preferred form of the dual control knob assembly and associated means.

FIG. 4 shows the CRO built on the novel principles of my invention. In this and all the subsequent drawings I will denote parts corresponding to those of the prior art instrument of FIGS. 1 and 2 by the same reference numerals as used above to designate the corresponding parts of the prior art and will omit any repeated description of such parts.

The improved CRO of FIG. 4 features a zero level switch circuit 60 connected between input selector 28 and attenuator 30, and a one-hand-operable dual control knob assembly 62 for manually operating the zero level switch circuit and the vertical position adjuster 34. The zero level switch circuit 60 includes a zero level switch 64 comprising a first fixed contact 66 connected to the output of the input selector 28, a second fixed contact 68 connected t ground, and a movable contact 70 connected to the input of the attenuator 30. Normally the movable contact 70 is in engagement with the first fixed contact 66 to allow the input signal to pass on toward the vertical amplifier 32. Upon engagement of the movable contact 70 with the second fixed contact 68 the signal input of the vertical amplifier 32 becomes grounded, with the result that the CRT displays a bright horizontal line on its screen 12.

Also included in the zero level switch circuit 60 are a relay coil 72 for actuating the movable contact 70 of the zero level switch 64 into engagement with the second fixed contact 68 on energization, and a control switch 74 for selective energization of the relay coil 72. The control switch 74 comprises a fixed contact 76 connected to the relay coil 72, and a movable contact 78 mounted on a cantilever spring and connected to a positive power supply terminal designated +V. Accordingly the closure of the control switch 74 results in the energization of the relay coil 72 and, as a consequence, in the grounding of the vertical amplifier 32.

Figure 5:
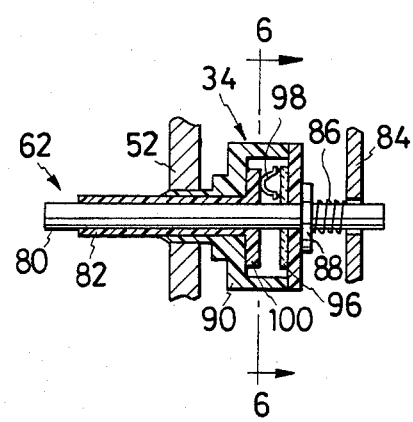
FIG. 5 is an axial section through the dual control knob assembly and the potentiometric vertical position adjuster operated thereby, in the CRO of FIG. 4.

As will be seen also from FIG. 5, the one-hand-operable dual control knob assembly 62 comprises a first knob 80 for actuating the control switch 74, and a second knob 82 for operating the vertical position adjuster 34. The first knob 80 is in the form of a short rod or pin whereas the second knob 82 is in the form of a tube sleeved upon the first knob so as to allow the longitudinal sliding motion thereof. Both first 80 and second 82 knobs project out of the front panel 52 of the instrument for manipulation by the user. The first knob 80 further slidably extends through a fixed support wall 84 disposed interiorly of the front panel 52 and terminates at the movable contact 78 of the control switch 74. Sleeved upon the first knob 80, a return spring 86 acts between the support wall 84 and a collar 88 on the first knob, biasing the same in a direction to project out of the front panel 52. Under the bias of this return spring the collar 88 normally butts on a fixed housing 90 of the vertical position adjuster 34. Thus, upon pushing of the first knob 80 against the force of the return spring 86, the control switch 74 becomes closed to cause energization of the relay coil 72.

The vertical position adjuster 34 to be operated by the second knob 82 takes the form of potentiometer or variable resistor. It is electrically connected as in the prior art CRO of FIG. 1.

Figure 6:
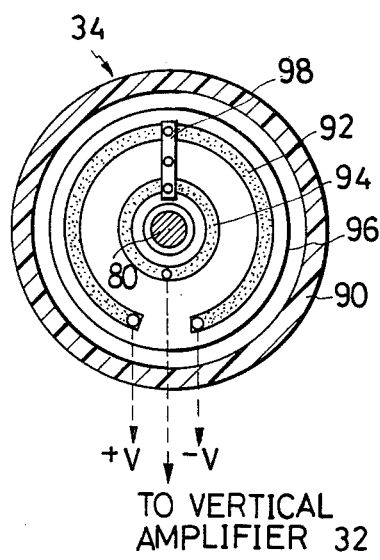
FIG. 6 is an enlarged section through the vertical position adjuster, taken along the line 6—6 of FIG. 5.

As illustrated in FIG. 5 and on an enlarged scale in FIG. 6, the vertical position adjuster 34 is accommodated in the fixed housing 90 disposed just behind the front panel 52. The adjuster comprises an annular resistor 92 and an annular electrode 94 placed concentrically on a disklike base 96 immovably supported within the housing 90 and loosely surrounding the first knob 80. Another member of the adjuster 34 is a revolving slider 98 affixed to a flange 100 on the inner end of the second knob 82 and making sliding engagement with both resistor 92 and electrode 94. The resistor 92 has its opposite extremities connected ot a DC power supply as indicated by the indicia +V and −V. The electrode 94 is connected to the vertical amplifier 32 for applying thereto the variable voltage for the adjustment of the vertical position of the display on the CRT screen 12.

Operation

For zero level adjustment preparatory to signal observation or measurement by the CRO of FIGS. 4 to 6, the input selector knob 48 of FIG. 2 may be left in the DC (or AC) position. The user may push the first knob 80 of the dual control knob assembly 62 against the force of the return spring 86. When pushed, the first knob 80 moves the movable contact 78 of the control switch 74 into engagement with the fixed contact 76. Thereupon the relay coil 72 becomes energized to activate the movable contact 70 of the zero level switch 64 into engagement with the second fixed contact 68 which is grounded. With the signal input of the vertical amplifier 32 thus grounded, the CRT displays a bright horizontal line representative of the zero signal level on its screen 12.

The user may further turn the second knob 82 of the dual control knob assembly 62 to adjust the zero level line to a desired vertical axis graduation on the CRT screen 12. He can turn the second knob 82 while pushing the first knob 80, using one hand.

Upon completion of zero level adjustment the user may release the dual control knob assembly 62. When released, the first knob 80 allows the control switch 74 to open and so to deenergize the relay coil 72. Then the movable contact 70 of the zero level switch 64 moves into reengagement with the fixed contact 66, directing the input signal toward the vertical amplifier 32. The CRT 10 displays the waveform of the amplified input signal on its screen 12, as depicted at 56 in FIG. 3 by way of example.

Thus the manipulation of only the dual control knob assembly 62 suffices for zero level adjustment and the subsequent display of the signal waveform on the CRT screen. If the user forgets the zero level position during the observation or measurement of the signal waveform, he may push the first knob 80 of the dual control knob assembly. Then the zero level line will appear on the CRT screen in the previously adjusted position. Further, upon release of the first knob, it will spring back to the illustrated normal position, causing the CRT to immediately display the signal waveform.

Alternate Embodiment

Figure 7:
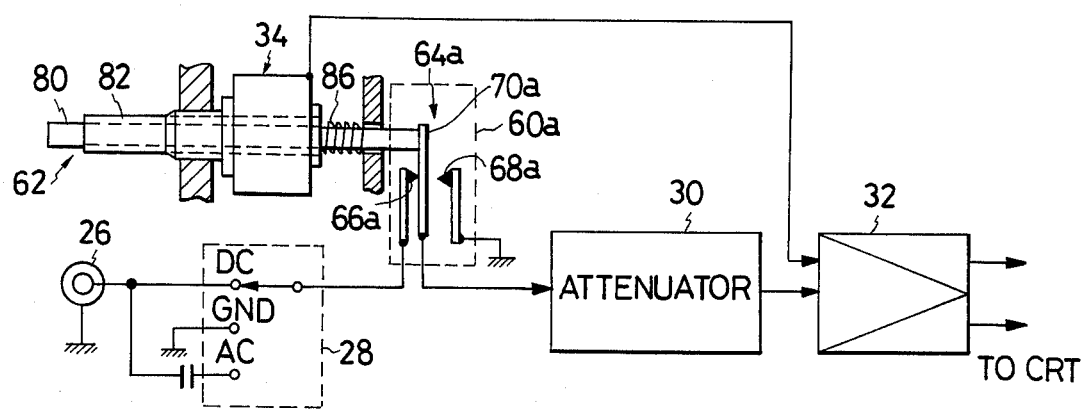
FIG. 7 is a schematic elelctrical diagram, partly in block form, of the vertical defection circuit of the CRO including another preferred form of the dual control knob assembly in accordance with my invention, the dual control knob assembly and the associated means being shown in elevation.

FIG. 7 shows the vertical deflection circuit of a CRO alternative to that of FIG. 4. In this alternative embodiment a zero level switch circuit 60a, connected between input selector 28 and attenuator 30, includes only a zero level switch 64a to be actuated directly by the first knob 80 of the dual control knob assembly 62. The zero level switch 64a comprises a first fixed contact 66a connected to the input selector 28, a second fixed contact 68a connected to ground, and a movable contact 70a connected to the attenuator 30. The movable contact 70a is affixed to the inner end of the first knob 80 of the dual control knob assembly 62.

Except for the direct attachment of the first knob 80 to the movable contact 70a of the zero level switch 64a, the dual control knob assembly 62 is identical in construction with that of the FIGS. 4 to 6 embodiment. Thus the return spring 86 normally holds the first knob 80 projecting out of the tubular second knob 82 to a preassigned degree, with the result that the movable contact 70a of the zero level switch 64a engages the first fixed contact 66a, allowing the input signal to pass from input terminal 26 to vertical amplifier 32 via the input selector 28 and attenuator 30. When pushed, the first knob 80 moves the movable contact 70a into engagement with the second fixed contact 68a thereby grounding the signal input of the vertical amplifier 32.

The other details of construction and operation are as set forth above in connection with FIGS. 4 to 6. The advantages offered by this alternate embodiment will also be apparent from the foregoing.

Second Alternate Embodiment

Figure 8:
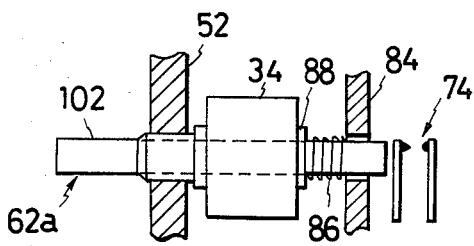
FIG. 8 is an elevation of still another preferred form of the dual control knob assembly and associated means in accordance with my invention.

Although the dual control knob assemblies in the two preceding embodiments each comprise two separate knobs for operating the vertical position adjuster and the zero level switch, only one knob can be used for the dual purpose. Thus, in FIG. 8, I have shown a modified dual control knob assembly 62a having a single knob 102 to be turned for operating the vertical position adjuster 34 and to be pushed for activating the control switch 74. As in the dual control knob assembly 62 the return spring 86 acts between support wall 84 and collar 88 to normally hold the knob 102 projecting out of the front panel 52 to a prescribed degree. The pushing of the knob 102 against the force of the return spring 86 results in the activation of the control switch 74.

The vertical position adjuster 34 can be analogous in construction and arrangement with those of the preceding embodiments except that its revolving slider is flexible to allow longitudinal displacement of the knob 102 to which it is attached. The control switch 74 forms a part of the zero level switch circuit 60 of FIG. 4. I could, however, use the modified zero level switch circuit 60a of FIG. 7 in combination with the dual control knob assembly 62a. The user may simultaneously push and turn the knob 102 for zero level adjustment and just push the knob for zero level reconfirmation.

Third Alternate Embodiment

Figure 9:
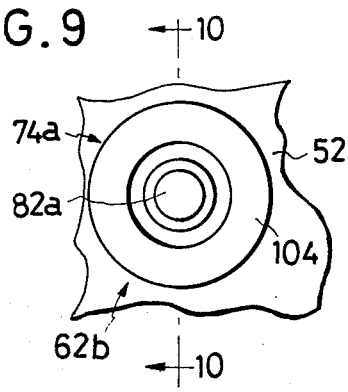
FIG. 9 is a front elevation of a further preferred form of the dual control knob assembly in accordance with my invention.
Figure 10:
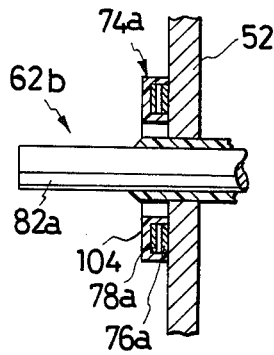
FIG. 10 is a section through the dual control knob assembly of FIG. 9, taken along the line 10—10 therein.

A further embodiment of my invention shown in FIGS. 9 and 10 features the so called "sheet switch", a thin switch operated by finger pressure, used as the control switch in the zero level switch circuit 60 of FIG. 4. Generally referenced 74a, the sheet switch comprises a thin, annular fixed contact 76a and a thin, annular, flexible movable contact 78a, both enclosed in an annular flexible housing 104 and normally held spaced from each other. The sheet switch 74a is mounted on the front panel 52 of the CRO so as to concentrically surround a knob 82a in the form of a solid rod to be turned for operating the vertical position adjuster 34 best illustrated in FIGS. 5 and 6.

Thus, in this embodiment, the knob 82a and the flexible housing 104 of the sheet switch 74a make up in combination a dual control knob assembly generally designated 62b. The user may simultaneously push the sheet switch housing 104 and turn the knob 82a for zero level adjustment and only push the sheet switch housing for zero level reconfirmation.

Modifications

Although I have shown and described my invention in terms of several preferable embodiments thereof, it is understood that these are by way of example only, since a variety of modifications or alterations will readily occur to the specialists on the basis of this disclosure. The following is a brief list of such possible modifications:

1. The vertical position adjuster 34 could be of other than the illustrated type. An example is one having a pair of variable resistors connected across signal input lines to a differential vertical amplifier, the two sliding contacts of the variable resistors being jointly operated by a common knob for controlling the output levels of the amplifier.
2. While a single-pole double-throw relay is used in FIG. 4 for the zero level switch 64, a single-pole single-throw design could be employed. An electronic switch was another possible choice.
3. The input selector 28 could be omitted.
4. A known "touch switch", one that is closed at the touch of a finger, could be used in place of the "sheet switch" 74a of FIGS. 9 and 10.

All these and other modifications within the usual knowledge of one skilled in the art are understood to fall within the scope of my invention as expressed in the following claims.

I claim:

1. A cathode ray oscilloscope of the kind having input means for the reception of a signal to be observed or measured, a vertical amplifier for amplifying the input signal, a cathode ray tube for displaying on a screen the amplified replica of the input signal, the cathode ray tube exhibiting on the screen a bright horizontal line representative of a zero signal level upon disconnection of the vertical amplifier from the input means, and a vertical position adjuster coupled to the vertical amplifier and operable manually for adjustably varying the vertical position of the display on the screen of the cathode ray tube, wherein the improvement comprises:
   (a) a zero level switch connected between the input means and the vertical amplifier and actuable manually for connecting and disconnecting the input means and the vertical amplifier to and from each other; and
   (b) a one-hand-operable dual control knob assembly for operating the vertical position adjuster and actuating the zero level switch;
   (c) whereby the zero signal level on the screen of the cathode ray tube is adjustable by the simple manipulation of the dual control knob assembly.

2. The cathode ray oscilloscope as set forth in claim 1, wherein the vertical position adjuster is a potentiometer having a revolving slider, and wherein the dual control knob assembly comprises:
   (a) a first knob to be pushed for actuating the zero level switch; and
   (b) a second knob sleeved upon the first knob and coupled to the revolving slider of the potentiometer for operating the same by being turned.

3. The cathode ray oscilloscope as set forth in claim 2, further comprising:
   (a) a relay coil for causing the zero level switch to disconnect the input means and the vertical amplifier on energization; and
   (b) a control switch actuated by the first knob of the dual control knob assembly for energizing the relay coil when the first knob is pushed.

4. The cathode ray oscilloscope as set forth in claim 2, wherein the first knob of the dual control knob assembly is coupled directly to a movable contact forming a part of the zero level switch.

5. The cathode ray oscilloscope as set forth in claim 1, wherein the vertical position adjuster is a potentiometer having a revolving flexible slider, and wherein the dual control knob assembly comprises:
   (a) a single knob coupled to the flexible slider of the potentiometer for operating the same by being turned, the knob being further adapted to be pushed for actuating the zero level switch.

6. The cathode ray oscilloscope as set forth in claim 1, wherein the vertical position adjuster is a potentiometer having a revolving slider, and wherein the dual control knob assembly comprises:
   (a) a knob coupled to the revolving slider of the potentiometer for operating the same by being turned; and
   (b) an annular flexible member surrounding the knob for actuating the zero level switch by being pushed.

7. The cathode ray oscilloscope as set forth in claim 6, further comprising:
   (a) a relay coil for causing the zero level switch to disconnect the input means and the vertical amplifier on energization; and
   (b) a control switch enclosed in the annular flexible member of the dual control knob assembly for energizing the relay coil when the flexible member is pushed, the control switch comprising a thin, annular fixed contact, and a thin, annular, flexible movable contact.

* * * * *